Feb. 14, 1967 J. J. KLINIKOWSKI 3,304,436

SEMICONDUCTOR COUNTING CIRCUITS

Filed July 5, 1963 2 Sheets-Sheet 1

INVENTOR.
JAMES J. KLINIKOWSKI
BY Robert A. Green
ATTORNEY

SEMICONDUCTOR COUNTING CIRCUITS

Filed July 5, 1963 2 Sheets-Sheet 2

INVENTOR.
JAMES J. KLINIKOWSKI
BY Robert A. Green
ATTORNEY

United States Patent Office 3,304,436
Patented Feb. 14, 1967

3,304,436
SEMICONDUCTOR COUNTING CIRCUITS

James J. Klinikowski, Somerville, N.J., assignor to Burroughs Corporation, Detroit, Mich., a corporation of Michigan Filed July 5, 1963, Ser. No. 292,956
8 Claims. (Cl. 307—88.5)

This invention relates to electronic counting circuits and particularly to semiconductor counting circuits.

One type of electronic semiconductor counting circuit utilizes a plurality of transistors as count-registering devices connected together to execute a series of counts. A diode matrix is used to interconnect the counting transistors and to control the application of counting pulses and the direction in which the counting operation proceeds. Such a circuit can be coupled to a decimal visual readout or indicator device to provide a direct visual indication of the counting operation. Several counting circuits of this type have been devised, and these circuits operate quite satisfactorily.

However, there is an ever-present need to reduce the size, complexity, and the number of components in circuits of the type under consideration, and the objects of the invention are directed toward this end.

Briefly, a counter circuit embodying the invention includes a plurality of count-registering devices, each of which comprises a separate odd or even step in a counting series. Each count-registering device includes an input and output electrode, and the output electrode of each counting device is coupled through a diode matrix to all of the other counting devices so that only one counting device performs the counting operation at a time. The diode matrix has a novel diode arrangement so that fewer diodes are required to perform the desired counting operation than have been used in the past.

The invention is described in greater detail by reference to the drawing wherein.

Figure 1:
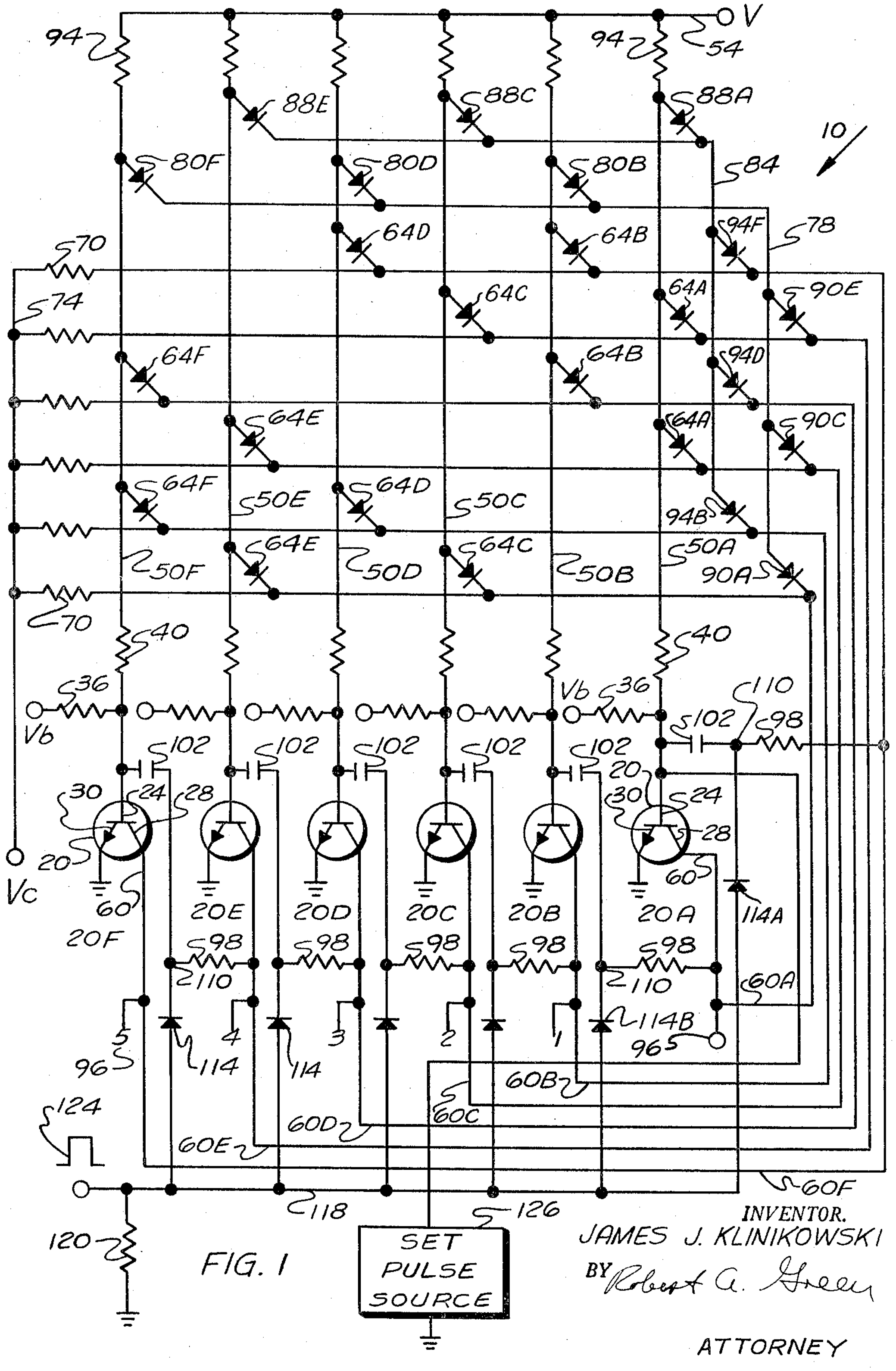
FIG. 1 is a schematic representation of a counter embodying the invention.

Referring to FIG. 1, a counter circuit 10 embodying the invention includes a plurality of count-registering current flow devices 20 which may be semiconductor devices such as transistors or the like which operate generally in the nature of switches. For convenience, NPN transistors are shown as the counting devices; however, it is clear that other types of semiconductor devices could be used. Each transistor is adapted to register one count, and the total number of transistors provided in the counting chain is determined by the total number of counts to be executed in a complete counting cycle. For convenience, only six counting steps are shown including transistors 20A, 20B, 20C, 20D, 20E, and 20F. Each transistor represents either an odd-numbered or even-numbered counting step.

Each transistor includes base, collector, and emitter electrodes, 24, 28, and 30, respectively. Each base or input electrode is coupled through a resistor 36 to a negative D.C. power source V*b* and through a resistor network 40 and 94 and lead 50 to a bus 54 which is coupled to a positive D.C. power source V. Each emitter electrode is connected to a source of reference potential such as ground.

The output or collector electrode 28 of each even-numbered transistor (20A, 20C, 20E) is connected through a lead 60 and a diode 64, oriented as shown, to the input or base electrode of every other even-numbered transistor. Thus, the collector of transistor 20A, representing zero count, is connected through lead 60A and diodes 64C, and 64E to the base electrodes of transistors 20C and 20E, respectively. Transistor 20C, representing a count of two, is connected through lead 60C and diodes 64A and 64E to the base electrodes of transistor 20A and 20E, etc.

Similarly, the output or collector electrode of each odd-numbered transistor (20B, 20D, 20F) is connected through a lead 60 and diode 64 to the input electrode of each other odd-numbered transistor. For example, transistor 20B, representing a count of one, is connected by lead 60B and diodes 64D and 64F to the base electrodes of transistors 20D and 20F, respectively; and the output of transistor 20D, representing a count of three, is connected by lead 60D and diodes 60A and 60C to the input electrodes of transistors 20A and 20C, respectively. The other transistors are similarly connected, depending on whether they are odd or even. The leads 60A, 60B, 60C, 60D, 60E, and 60F are coupled through resistors 70 and bus 74 to power supply V*c*.

According to the invention, auxiliary means are provided for coupling the output of each even-numbered transistor to the input of each odd-numbered transistor and for coupling the output of each odd-numbered transistor to the input of each even-numbered transistor. This auxiliary means includes a first lead 78 coupled through diodes 80B, 80D, 80F, oriented as shown, to the input leads 50B, 50D, 50F, respectively, of the odd-numbered transistors 20B, 20D, and 20F. The auxiliary means also includes a second lead 84 coupled through diodes 88A, 88C, and 88E, oriented as shown, to the input leads 50A, 50C, and 50E of the even-numbered transistors 20A, 20C, and 20E. Thus, lead 78 provides a common connection to the inputs of the odd-numbered transistors 20, and the lead 84 provides a common connection to the inputs of the even-numbered transistors 20.

The common leads 78 and 84 and their associated diodes are used as follows. The output electrodes 28 of each even-numbered transistor is coupled through its lead 60 and a diode 90 to lead 78, and the output of each odd-numbered transistor is coupled through its lead 60 and a diode 94 to lead 84. Thus, the output electrodes of transistors 20A, 20C, and 20E are coupled through diodes 90A, 90C, and 90E, respectively, to lead 78, and the output electrodes of transistors 20B, 20D, and 20F are coupled through diodes 94B, 94D, and 94F, respectively, to lead 84. The diodes 90 isolate the outputs of the even-numbered transistors from each other, and the diodes 94 isolate the outputs of the odd-numbered transistors from each other.

In order to provide a visual readout of the counting operation, each collector electrode 28 is coupled to the appropriate cathode indicator electrode numeral 96 of an indicator tube such as a type 6844A tube. The other portions of the tube are not shown. Of course, other types of readout or utilization devices could also be employed with circuit 10.

In order to apply counting pulses to circuit 10 and to control the direction in which the counting operation proceeds, the following connections are made. Each collector electrode 28 is coupled through a resistor 98 and a capacitor 102 to the base electrode of the next adjacent transistor in the counting chain. Thus, the collector of transistor 20A is coupled to the base of 20B, the collector of 20B is coupled to the base of 20C, etc. In addition, the junction 110 between each resistor and capacitor is coupled through a diode 114, oriented as shown, to a lead 118 which is connected both through a resistor 120 to ground and to a source (not shown) of positive counting pulses or waves 124.

A source 126 of positive pulses which may be used either to set or reset the counter circuit 10 is coupled to the base electrode 24 of transistor 20A which is arbitrarily designated the first transistor to be turned on in the counting cycle.

In operation of the circuit of the invention, when power is first turned on, some one of the transistros 20 will tend to turn on. If it is desired to avoid this random turn-on, the set pulse source 126 is operated to turn on transistor 20A and thus prepare the counter 10 to execute a counting cycle. However, for purposes of illustration, let it be assumed that none of the transistors is turned on when power is applied. With no transistors turned on, the anodes of the diodes 114 are at about ground potential and the cathodes thereof, which are coupled to collector electrodes 28, are at generally positive potentials when the transistors are not conducting. Thus, the diodes 114 are reverse-biased by a relatively large amount, for example, 50 or 60 volts, and are, in effect, closed gates. The counter 10 is set in operation by the application of a pulse from the source 126 to the base electrode of transistor 20A which is turned on thereby. When the transistor 20A is turned on, its collector electrode 28 is reduced to about ground potential, and this potential is coupled through lead 60A and diodes 64C and 64E to the base electrodes of transistors 20C and 20E, respectively, which are thus held off. The potential of the collector electrode of transistor 20A is also coupled through diode 90A to lead 78 and through diodes 80B, 80D, and 80F to the base electrodes of transistors 20B, 20D, and 20F which are held off. Thus, when transistor 20A is on and registering a count, it holds off all of the other transistors.

The potential of the collector electrode 28 of transistor 20A is also applied to the cathode of the associated diode 114A which is still reverse-biased but is now reverse-biased by a smaller amount, for example, less than one volt. Thus, the diode 114A may be considered to be prebiased or primed so that, when a positive counting pulse 124, of perhaps 40 volts, is applied to the lead 118 and thus to all of the diodes 114, only the primed diode 114A can couple this pulse to the base electrode of transistor 20B. Thus, only transistor 20B can be turned on. The resulting drop in potential of the collector electrode of transistor 20B, now operating through lead 60B and diodes 64, and through diode 94, lead 84, and diodes 88, holds off all of the other transistors 20 and primes the next successive diode 114B coupled between transistor 20B and 20C. Thus, the next counting pulse turns on transistor 20C. In this way, each successive counting pulse causes the count to be transmitted from one transistor to the next in order.

Figure 2:
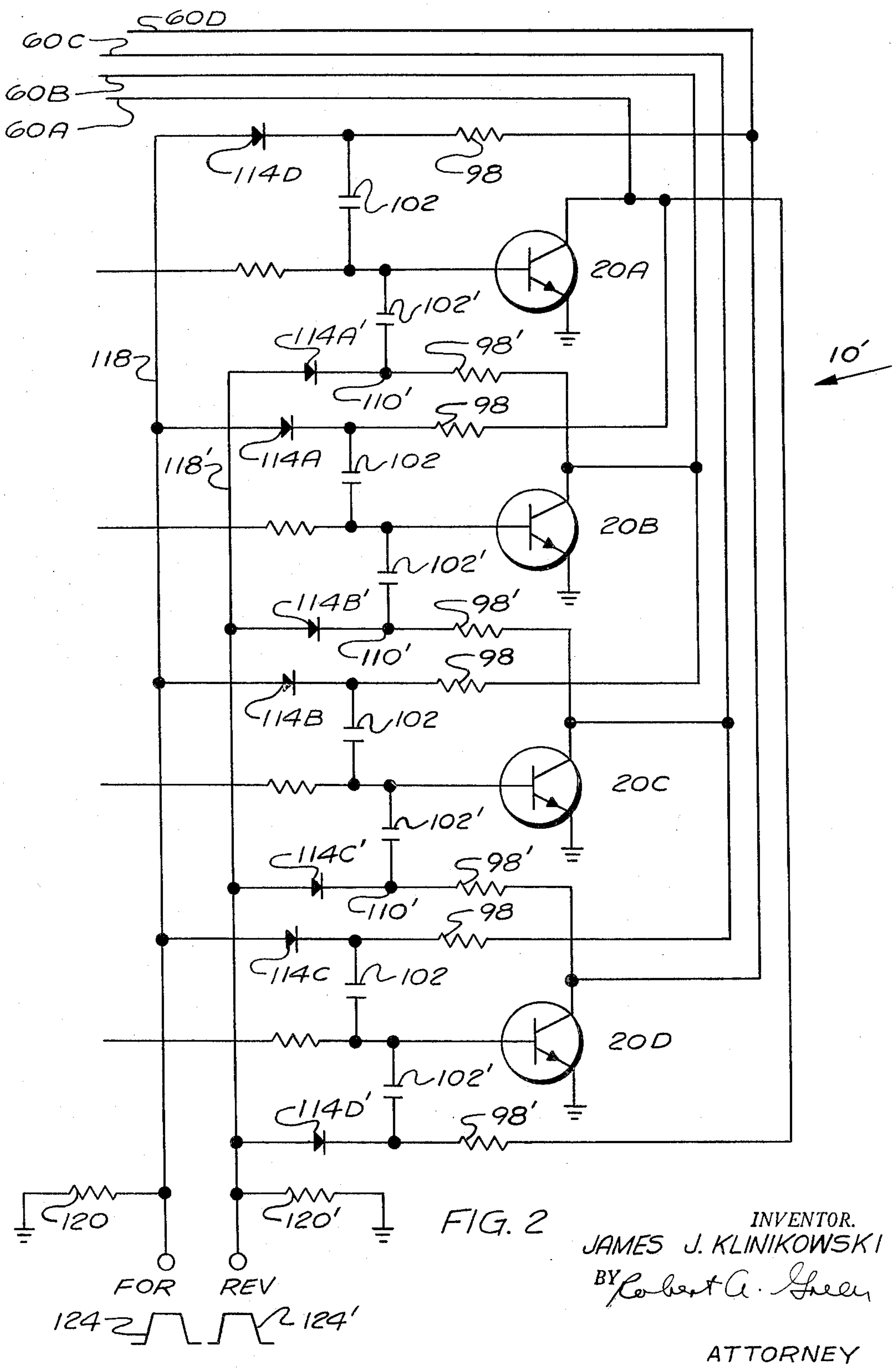
FIG. 2 is a schematic representation of a portion of an embodiment of the invention operable as a reversible counter.

The circuit described above may also be adapted to operate as a reversible counter. The reversible counter circuit 10′ shown in FIG. 2 includes all of the circuit elements of FIG. 1 and, in addition, an auxiliary coupling arrangement between counter stages to permit counting in the reverse direction from transistor 20D to 20C to 20B to 20A, etc. In the auxiliary coupling arrangement, each collector electrode 28 of each transistor 20 is coupled through a resistor-capacitor-diode network, as described above, to the base electrode of the next adjacent transistor in the reverse counting order. Thus, the collector electrode of transistor 20D is connected through a resistor 98′ and capacitor 102′ to the base electrode of transistor 20C. The collector electrode of transistor 20C is connected through a resistor 98′ and capacitor 102′ to the base electrode of transistor 20B, etc. In addition, the junction 110′ of each resistor 98′ and capacitor 102′ is coupled through a diode 114′, oriented as shown, to a lead 18′ which is connected through a resistor 120′ to ground and to a source (not shown) of positive counting pulses 124′.

The operation of the reversible counter circuit of the invention is identical to that described above except that the direction in which the counting operation progresses is determined by the lead 118 or 118′, to which the counting pulses 124 and 124′ are applied. Thus, pulses applied to lead 118 cause the count to proceed in a forward direction from the transistor 20A to 20D, and pulses applied to lead 118′ cause the counting operation to proceed in a reverse direction from 20D to 20A.

The present invention has the important advantage that it permits the fabrication of a decade counter which uses a matrix of 60 diodes in place of a matrix of 90 diodes used in comparable counters in the prior art. This represents considerable advantage when the entire diode matrix is prepared in a unit on a single wafer of semiconductor material.

What is claimed is:

1. A counting circuit including
- a plurality of count-registering devices connected to execute a series of counts,
- each count-registering device occupying either an odd-numbered or even-numbered position in the counting series and thus being designated an odd device or an even device,
- each device having an input and an output,
- a connection from the output of each even device through a diode to the input of every other even device,
- a connection from the output of each odd device through a diode to the input of every other odd device,
- a first auxiliary line coupled through a diode to the input of each odd device,
- a second auxiliary line coupled through a diode to the input of each even device,
- the output of each even device also being coupled through an auxiliary diode to said first auxiliary line,
- the output of each odd device also being coupled through an auxiliary diode to said second auxiliary line,
- said auxiliary diodes being oriented so that the output of an even device is isolated from the outputs of the other even devices and the output of each odd device is isolated from the outputs of the other odd devices, all of said diodes being oriented so that as each device registers a count, the electrical potential of its output is coupled to the input of every other device, this electrical potential being such that every other device is prevented from registering a count.

2. The circuit defined in claim 1 and including further means coupled between adjacent count-registering devices causing the counting operation to proceed from one device to the next in order.

3. The counter circuit defined in claim 1 and including a source of counting pulses coupled to the input of each count-registering device,
- a separate gate means in the path between said source of counting pulses and each count-registering device,
- and a connection from the output of each count-registering device to said gate means whereby each device as it performs a counting operation, prebiases another selected gate means so that a counting pulse can be applied through said other selected gate means to the input of the device associated therewith which may be turned on thereby.

4. A counter circuit as defined in claim 1 and including
- means coupled to all of the inputs of said count-registering devices for applying counting pulses thereto,
- a separate gate means coupled between said last-named means and each of said devices for controlling the application of counting pulses to the inputs of said devices,
- and a connection from the output of each device to said gate means whereby each device as it performs a counting operation, prebiases the next successive gate means so that a counting pulse can be applied through said next successive gate means to the input of the next successive discharge device which may be turned on thereby.

5. The counting circuit defined in claim 1 and including a source of signal pulses coupled to all of said devices for applying pulses to all of said devices simultaneously, electronic gate means coupled between the output of each count-registering device and the input of an adjacent device in a selected counting order, said gate means including a diode which is reverse-biased so that it is normally closed to said pulses when it is coupled between two devices which are not registering counts, one selected gate being primed to open and pass a signal pulse, said selected gate being so primed by an adjacent count-registering device which is in the state of registering a count.

6. The circuit defined in claim 1 wherein the output of each register device is coupled through an impedance network to the input of the next device in the counting order, the impedance network being coupled through a diode to a source of reference potential so that normally when a register device is not registering a count, the diode located between it and the next register device is reverse-biased and cannot pass a signal from said signal source, however, when a register device is in the state of registering a count, it prebiases the diode coupled between it and the next register device in the counting chain so that the last-mentioned diode can pass a signal pulse which can be registered by said next register device.

7. The circuit defined in claim 1 wherein the output of each register device is coupled through an impedance network to the input of the next device in the counting order, the impedance network being coupled through a diode to a source of reference potential so that normally when a register device is not registering a count, the diode located between it and the next register device is reverse-biased and cannot pass a signal from said signal source, however, when a register device is in the state of registering a count, it prebiases the diode coupled between it and the next register device in the counting chain so that the last-mentioned diode can pass a signal pulse which can be registered by said next register device, said impedance network comprising a resistor and capacitor in series with the diode connected to the junction of the resistor and capacitor.

8. An electronic counting circuit as defined in claim 1 and including a first source of signal pulses, a first set of electronic gates coupled between said register devices and said first source of signal pulses for controlling the application of said pulses to said registers, first circuit means coupling each count-registering device to the next adjacent count-registering device in a first counting direction, each of said first circuit means being coupled through one gate of said set to said first signal source, a second source of signal pulses, a second set of electronic gates coupled between said count-registering devices and said second source of signal pulses for controlling the application of signal pulses to said count-registering devices, second circuit means coupling each count-registering device to the next adjacent count-registering device in the opposite counting direction, all of said gates being biased so that they are normally closed to said pulses except for a selected gate which is primed to open and pass a signal pulse, said selected gate being so primed by a count-registering device to which it is coupled and which is in the state of registering a count.

References Cited by the Examiner

UNITED STATES PATENTS

| | | | |
|---|---|---|---|
| 3,005,917 | 10/1961 | Hofmann | 307—88.5 |
| 3,192,406 | 6/1965 | Somlyody | 307—88.5 |

ARTHUR GAUSS, *Primary Examiner.*

J. ZAZWORSKY, *Assistant Examiner.*